United States Patent [19]

Crivello

[11] 4,175,972

[45] * Nov. 27, 1979

[54] CURABLE EPOXY COMPOSITIONS CONTAINING AROMATIC ONIUM SALTS AND HYDROXY COMPOUNDS

[75] Inventor: James V. Crivello, Clifton Park, N.Y.

[73] Assignee: General Electric Company, Schenectady, N.Y.

[ * ] Notice: The portion of the term of this patent subsequent to Nov. 15, 1994, has been disclaimed.

[21] Appl. No.: 840,092

[22] Filed: Oct. 6, 1977

Related U.S. Application Data

[63] Continuation of Ser. No. 638,982, Dec. 9, 1975, Pat. No. 4,058,401, which is a continuation of Ser. No. 466,374, May 2, 1974, abandoned.

[51] Int. Cl.$^2$ .................. G03C 1/68; C03F 8/18; C08F 2/46
[52] U.S. Cl. .................. 204/159.18; 204/159.23; 204/159.24; 106/20
[58] Field of Search ............. 96/115 R, 115 P, 35.1, 96/86.17; 204/159.18, 159.23, 159.24; 106/20; 260/2 EP, 2 EC, 47 EC, 47 EP

[56] References Cited

U.S. PATENT DOCUMENTS

| | | | |
|---|---|---|---|
| 2,935,488 | 5/1960 | Phillips et al. | 260/45.4 |
| 3,412,046 | 11/1968 | Payne | 260/47 EC |
| 3,729,313 | 4/1973 | Smith | 96/27 R |
| 3,816,280 | 6/1974 | Watt | 96/115 P |
| 3,816,281 | 6/1974 | Feinberg | 204/159.23 |
| 3,826,650 | 6/1974 | Schlesinger | 204/159.23 |
| 4,058,400 | 11/1977 | Crivello | 96/86 P |
| 4,058,401 | 11/1977 | Crivello | 96/115 R |

OTHER PUBLICATIONS

"Encyclopedia of Polymer Science and Technology", vol. 6, 1967, pp. 223, 226, 237–238, Interscience Publication, New York.
Irving et al., J. Chem. Soc. (1960), pp. 2078–2081.
Banks, Chemical Review, vol. 66, No. 3 (1966), pp. 243–263.
Knapczyk et al., J. Org. Chem., vol. 35, No. 8 (1970), pp. 2539–2543.
Fieser et al., Org. Chem. 3rd Ed. Reinhold, pp. 140–141.
Hach's Chemical Dictionary, 1969, p. 23.

*Primary Examiner*—Jack P. Brammer
*Attorney, Agent, or Firm*—William A. Teoli; Joseph T. Cohen

[57] ABSTRACT

Cationic polymerization of epoxy resin materials, such as epoxy monomers or prepolymers, can be achieved by use of certain radiation sensitive aromatic onium salts of Group VIa elements. Curable compositions are provided which can be used as sealants, coating compounds, encapsulants, etc.

8 Claims, No Drawings

CURABLE EPOXY COMPOSITIONS CONTAINING AROMATIC ONIUM SALTS AND HYDROXY COMPOUNDS

This application is a continuation of copending application Ser. No. 638,982, filed Dec. 9, 1975, now U.S. Pat. No. 4,058,401 which is a continuation application of Ser. No. 466,374, filed May 2, 1974, now abandoned.

The present invention relates to epoxy resin compositions which can be cured by exposure to radiant energy.

Epoxy resins have generally been employed in a variety of applications requiring high performance materials. Cure of an epoxy resin can generally be achieved by two package systems based on the incorporation into the resin of active amine containing compounds or carboxylic acid anhydrides. These systems require thorough mixing of the ingredients; in addition, cure time can be several hours.

Another catalyst which can be used to cure epoxy resins as "one package" systems is based on the employment of a Lewis Acid catalyst in the form of an amine complex such as boron trifluoride-monoethyl amine. The Lewis Acid is released on heating; cure takes place within 1 to 8 hours and can require a temperature of 160° C. and higher. As a result, these one package epoxy compositions cannot be employed to coat heat sensitive devices such as delicate electronic components. Nor can epoxy monomers having low boiling points be used due to the resulting losses to evaporation during cure.

As shown by Schlisinger, U.S. Pat. No. 3,703,296, certain photosensitive aromatic diazonium salts can be employed to cure epoxy resins. When photolyzed, these aromatic diazonium salts are capable of releasing, in situ, a Lewis Acid catalyst which can initiate the rapid polymerization of the epoxy resin. However, even though these one package epoxy resin mixtures can provide fast curing compositions, a stabilizer must be used to minimize cure in the dark during storage of these mixtures. Despite these measures, gellation of the mixture can occur even in the absence of light. In addition, nitrogen is released during UV-cure, which can result in film imperfections. Diazonium salts are generally thermally unstable, rendering the use of such materials hazardous because of the possibility of run-away decomposition.

The present invention is based on the discovery that radiation sensitive aromatic onium salts of Group VIa elements, such as

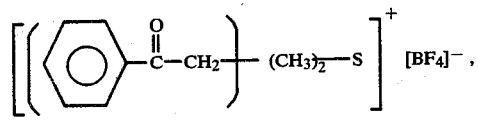

can be incorporated in epoxy resins to provide one package radiation curable compositions which do not require a stabilizer to minimize cure at ambient temperatures during the shelf period, and are free of all of the aforementioned disadvantages of the aromatic diazonium salt compositions.

Included by the aromatic Group VIa onium salts which can be used to make the curable compositions of the invention are compounds of the formula,

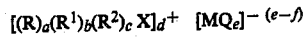

where R is a monovalent aromatic organic radical, $R^1$ is a monovalent organic aliphatic radial selected from alkyl, cycloalkyl and substituted alkyl, $R^2$ is a polyvalent organic radical forming a heterocyclic or fused ring structure selected from aliphatic radicals and aromatic radicals, X is a Group IVa element selected from sulfur, selenium and tellurium, M is a metal or metalloid, Q is a halogen radical, a is a whole number equal to 0 to 3 inclusive, b is a whole number equal to 0 to 2 inclusive, c is a whole number equal to 0 or 1, where the sum of a+b+c is a value equal to 3 or the valence of X, d=e−f f=valence of M and is an integer equal to from 2 to 7 inclusive e is >f and is an integer having a value up to 8.

Radicals included by R are, for example, $C_{(6-13)}$ aromatic hydrocarbon radicals such as phenyl, tolyl, naphthyl, anthryl, and such radicals substituted with up to 1 to 4 monovalent radicals such as $C_{(1-8)}$ alkoxy, $C_{(1-8)}$ alkyl, nitro, chloro, hydroxy, etc.; arylacyl radicals such as benzyl, phenylacyl, etc.; aromatic heterocyclic radicals such as pyridyl, furfuryl, etc. $R^1$ radicals include $C_{(1-8)}$ alkyl, such as methyl, ethyl, etc., substituted alkyl such as $-C_2H_4OCH_3$, $-CH_2COOC_2H_5$, $-CH_2COCH_3$, etc. $R^2$ radicals include such structures as:

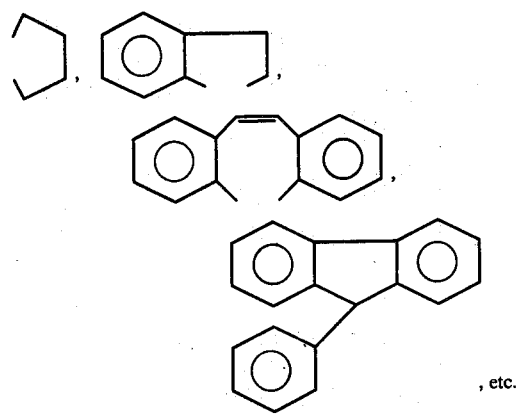

, etc.

Complex anions included by $MQ_e^{-(e-f)}$ of formula I are, for example, $BF_4^-$, $PF_6^-$, $AsF_6^-$, $SbF_6^-$, $FeCl_4^-$, $SnCl_6^-$, $SbCl_6^-$, $BiCl_5^=$, $AlF_6^{-3}$, $GaCl_4^-$, $InF_4^-$, $TiF_6^=$, $ZrF_6^-$, etc., where M is a transition metal such as Sb, Fe, Sn, Bi, Al, Ga, In, Ti, Zr, Sc, V, Cr, Mn, Cs, rare earth elements such as the lanthanides, for example, Ce, Pr, Nd, etc., actinides, such as Th, Pa, U, Np, etc. and metalloids such as B, P, As, etc.

Group VIa onium salts included by Formula I are, for example,

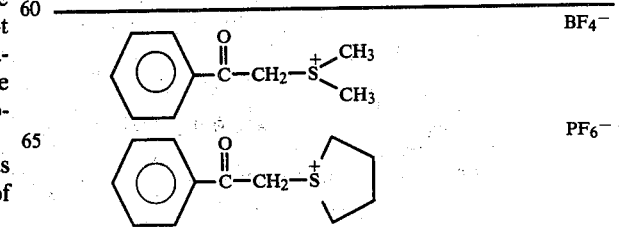

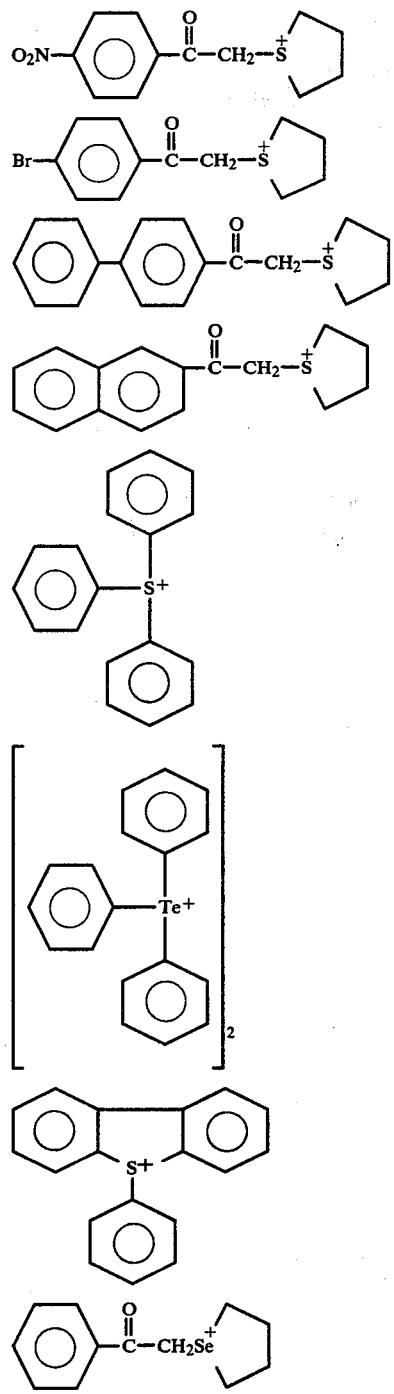

There is provided by the present invention curable epoxy compositions comprising, (A) an epoxy resin polymerizable to a higher molecular weight state selected from epoxy monomer, epoxy prepolymer, oxirane containing organic polymer and mixtures thereof, and (B) an effective amount of a radiation sensitive aromatic Group VIa onium salt capable of effecting the cure of (A) by release of a Lewis Acid catalyst when exposed to radiant energy.

Group IVa onium salts of formula I are well known and can be made by the procedure shown in J. W. Knapczyk and W. E. McEwen, J. Am. Chem. Soc., 91 145, (1969); A. L. Maycock and G. A. Berchtold, J. Org. Chem. 35, No. 8, 2532 (1970); H. M. Pitt, U.S. Pat. No. 2,807,648, E. Goethals and P. De Radzetzky, Bul. Soc. Chim. Bleg., 73 546 (1964); H. M. Leicester and F. W. Bergstrom, J. Am. Chem. Soc., 51 3587 (1929), etc.

The term "epoxy resin" as utilized in the description of the curable compositions of the present invention, includes any monomeric, dimeric or oligomeric or polymeric epoxy material containing one or a plurality of epoxy functional groups. For example, those resins which result from the reaction of bisphenol-A (4,4'-isopropylidenediphenol) and epichlorohydrin, or by the reaction of low molecular weight phenol-formaldehyde resins (Novolak resins) with epichlorohydrin, can be used alone or in combination with an epoxy containing compound as a reactive diluent. Such diluent as phenyl glycidyl ether, 4-vinylcyclohexene dioxide, limonene dioxide, 1,2-cyclohexene oxide, glycidyl acrylate, glycidyl methacrylate, styrene oxide, allyl glycidyl ether, etc., may be added as viscosity modifying agents.

In addition, the range of these compounds can be extended to include polymeric materials containing terminal or pendant epoxy groups. Examples of these compounds are vinyl copolymers containing glycidyl acrylate or methacrylate as one of the comonomers. Other classes of epoxy containing polymers amenable to cure using the above catalysts are epoxy-siloxane resins, epoxy-polyurethanes and epoxy-polyesters. Such polymers usually have epoxy functional groups at the ends of their chains. Epoxy-siloxane resins and method for making are more particularly shown by E. P. Plueddemann and G. Fanger, J. Am. Chem. Soc. 81 632–5 (1959). As described in the literature, epoxy resins can also be modified in a number of standard ways such as reactions with amines, carboxylic acids, thiols, phenols, alcohols, etc. as shown in U.S. Pat. Nos. 2,935,488; 3,235,620; 3,369,055; 3,379,653; 3,398,211; 3,403,199; 3,563,850; 3,567,797; 3,677,995; etc. Further examples of epoxy resins which can be used are shown in the Encyclopedia of Polymer Science and Technology, Vol. 6, 1967, Interscience Publishers, New York, pp. 209–271.

The curable compositions of the present invention can be made by blending the epoxy resin, which hereinafter will signify epoxy monomer, epoxy prepolymer, epoxy polymer or mixture thereof, with an effective amount of the Group VIa onium salt or "onium salt". The resulting curable composition which can be in the form of a varnish having a viscosity of from 1 centipoise to 100,000 centipoises at 25° C. or a free flowing powder, can be applied to a variety of substrates by conventional means and cured to the tack-free state within 1 second or less to 10 minutes or more.

Depending upon the compatibility of the onium salt with the epoxy resin, the Group IVa onium salt can be dissolved or dispersed therein along with an organic solvent such as nitromethane, acetonitrile, etc., prior to its incorporation. In instances where the epoxy resin is a solid, incorporation of the onium salt can be achieved by dry milling or by melt mixing the resin whereby the onium salt is incorporated.

It has been found that the onium salt also can be generated in situ in the presence of the epoxy resin if desired. For example, an onium salt of the formula,

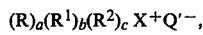

where R, $R^1$, $R^2$, X, a, b and c are as previously defined, and Q' is an anion such as $Cl^-$, $Br^-$, $I^-$, $F^-$, $HSO_4^-$, $NO_3^-$, etc., can be separately or simultaneously introduced into the epoxy resin with a Lewis Acid salt of the formula

M'[MQ]

where M' is a metal cation, such as $Na^+$, $K^+$, $Ca^{++}$, $Mg^{++}$, $Fe^{++}$, $Ni^{++}$, $Co^{++}$, $Zn^{++}$, etc. and organic cations such as ammonium, pyridinium, etc., and where [MQ] is defined in formula I above.

Experience has shown that the proportion of onium salt to epoxy resin can vary widely inasmuch as the salt is substantially inert, unless activated. Effective results can be achieved if a proportion of from 0.1% to 15% by weight of onium salt is employed, based on the weight of curable composition.

The curable compositions may contain inactive ingredients such as inorganic fillers, dyes, pigments, extenders, viscosity control agents, process aids, UV-screens, etc. in amounts of up to 100 parts of filler per 100 parts of epoxy resin. The curable compositions can be applied to such substrates as metal, rubber, plastic, molded parts or films, paper, wood, glass cloth, concrete, ceramic, etc.

Some of the applications in which the curable compositions of the present invention can be used are, for example, protective, decorative and insulating coatings, potting compounds, printing inks, sealants, adhesives, photoresists, wire insulation, textile coatings, laminates, impregnated tapes, printing plates, etc.

Cure of the curable composition can be achieved by activating the onium salt to provide the release of the Lewis Acid catalyst. Activation of the onium salt can be achieved by heating composition at a temperature in the range of from 150° C. to 250° C. Preferably cure can be achieved by exposing the curable composition to radiant energy such as electron beam or ultraviolet light. Electron beam cure can be effected at an accelerator voltage of from about 100 to 1,000 KV. Cure of the compositions is preferably achieved by the use of UV irradiation having a wavelength of from 1849 Å to 4000 Å and an intensity of at least 5,000–80,000 microwatts per cm². The lamp systems used to generate such radiation can consist of ultraviolet lamps such as from 1 to 50 dicharge lamps, for example, xenon, metallic halide, metallic arc, such as a low, medium or high pressure mercury vapor discharge lamp, etc. having an operating pressure of from a few millimeters to about 10 atmospheres, etc., can be employed. The lamps can include envelopes capable of transmitting light of a wavelength of from about 1849 Å to 4000 Å, and preferably 2400 Å to 4000 Å. The lamp envelope can consist of quartz, such as Spectrocil, or Pyrex, etc. Typical lamps which can be employed for providing ultraviolet radiation are, for example, medium pressure mercury arcs, such as the GE H3T7 arc and the Hanovia 450 W arc lamp. The cures may be carried out with a combination of various lamps, some or all of which can operate in an inert atmosphere. When using UV lamps, the irradiation flux on the substrate can be at least 0.01 watts per square inch to effect cure of the organic resin within 1 to 20 seconds and permit the cure to be carried on continuously as, for example, in the curing of epoxy-coated steel strip to be taken up at a rate of from 100 to 600 feet per minute. The strip can be cut to a predetermined width for use as transformer laminates, etc. A combination of heat and light may be used to cure reactive compositions. Such a combination of heat and light may serve to reduce the overall cure time.

In order that those skilled in the art will be better able to practice the invention, the following examples are given by way of illustration and not by way of limitation. All parts are by weight.

EXAMPLE 1

A curable composition was prepared by forming a mixture of 0.2 part of triphenylsulfonium tetrafluoroborate dissolved in acetonitrile and 5 parts of 4-vinylcyclohexene dioxide. A 2 mil film was drawn on a glass plate and exposed to ultraviolet irradiation from a GE H3T7 lamp at a distance of from 6 inches. The resin had cured to a hard film within 30 seconds. The film was found to be insoluble in dipolar aprotic solvents and it could not be scratched with a fingernail.

A portion of the above curable composition having a viscosity at 25° C. of about 6 centipoises was allowed to stand under average daylight conditions for four months in a transparent container. It was found that the viscosity remained substantially the same.

A portion of the curable composition was applied onto a steel strip. The treated steel surface was exposed 15 seconds to the ultraviolet radiation of an H3T7 lamp at a distance of 2 inches. A clear, tack-free film was formed which showed no signs of bubbles or other imperfections.

The above treated strip was then immersed in 10 C. hydrocarbon oil for 48 hours at 120° C. to determine its hydrolytic stability in accordance with IFT test ASTM D971-50 Interfacial Tension of Oil Against Water shown on page 322 of the 1970 Annual Book of ASTM Standards, part 17 (November). The initial reading of the oil was about 39.0 dynes/cm. After the test the oil showed an interfacial tension reading of 38. In order to pass, a reading of at least 30 is required.

EXAMPLE 2

An 80:20 mixture of an epoxy novolak resin, an epoxy equivalent weight of 173 and 4-vinylcyclohexene dioxide was sensitized with 3% by weight of triphenylsulfonium hexafluoroantimonate. This solution was used to impregnate glass cloth. Two 6 in×6 in squares of the cloth were then stacked together and cured to form a laminate by irradiating the cloth for 1 minute on each side using a GE H3T7 lamp at a distance of six inches. The stiff laminate was integrally bonded and could be used for circuit boards.

EXAMPLE 3

Triphenylselenonium chloride was prepared according to the procedure of H. M. Leicester and F. W. Bergstrom, J. Am. Chem. Soc., 51 3587 (1929) starting with diphenyl selenide. The corresponding fluoroborate, hexafluoroarsenate and hexafluoroantimonate salts were prepared by adding sodium hexafluoroarsenate, sodium tetrafluoroborate or potassium hexafluoroantimonate to an aqueous solution of triphenylselenonium chloride. The products were white crystalline solids which were dried in vacuo.

Three percent solutions of the above salts in 4-vinylcyclohexene dioxide were cured as 2 mil films at a distance of six inches from a GE H3T7 lamp. The following cure times were observed:

| Salt | Cure Time |
| --- | --- |
| $(C_6H_5)_3Se^+BF_4^-$ | 10 sec. |
| $(C_6H_5)_3Se^+AsF_6^-$ | 5 sec. |
| $(C_6H_5)_3Se^+SbF_6^-$ | 3 sec. |

EXAMPLE 4

There were added three parts phenacyl tetramethylene sulfonium hexafluoroarsenate to a 70:30 mixture of bisphenol-A-diglycidyl ether and 4-vinylcyclohexene dioxide. The catalyzed mixture of epoxides was then used to impregnate a 1 inch wide glass fabric tape. After winding one layer onto a 5"×2" diameter cylinder, the impregnated tape was cured while rotating the wound cylinder under a GE H3T7 lamp. The total exposure time to UV light was 5 minutes. At the end of this time the tape was fully cured into the shape of a rigid cylinder. The wound cylinder could then be used as a spool for winding wire to make transformer coils.

EXAMPLE 5

A mixture was prepared consisting of 14.5 g (0.25 mole) glycidyl allyl ether, 10 mg t-butylcatechol, and three drops of chloroplatinic acid in octyl alcohol. The reaction mixture was heated to 50° C. in a water bath and then 13.0 g of a polydimethyl siloxane resin containing 0.89% by weight Si-H groups was added dropwise by means of a dropping funnel. Immediate exothermic reaction took place with the temperature rising to 65° C. Reaction proceeded smoothly at this temperature giving a clear fluid resin.

Three parts by weight of triphenylsulfonium fluoroborate dissolved in a small amount of acetonitrile was added to 97 parts of the above silicone epoxy resin. A 2 mil film of the sensitized resin was drawn on a glass plate and then exposed to UV light from a GE H3T7 lamp at a distance of six inches. The film was tack-free within 15 to 20 seconds. A small amount of silica was added to the sensitized resin to produce a thixotropic mixture and the resin cured as described previously. A tough, rubbery coating resulted. These UV cured epoxy-siloxanes are useful as sealants and caulks.

EXAMPLE 6

There were added 3 parts S-phenyldibenzothiophenium fluoroborate to 97 parts 4-vinylcyclohexene dioxide. This mixture was spread on a glass plate as a 2 mil film and exposed to irradiation from a GE H3T7 lamp at a distance of six inches. One minute exposure was required to fully cure the film to a hard, scratch resistant state.

EXAMPLE 7

A 3% solution of phenacyl tetramethylene sulfonium hexafluoroarsenate in 40:60 mixture of 4-vinylcyclohexene dioxide and an epoxy novolak having an epoxy equivalent weight of 206 were knife coated onto a steel plate to a thickness of 3 mil. A mask was placed over the film and the entire assembly irradiated for 1 minute. The mask was removed and the film was washed with i-propanol. The unexposed portions of the film were washed away having a clear sharp negative image of the mask.

EXAMPLE 8

There were added 6 parts of a 50% aqueous solution of triphenylsulfonium chloride and 2.1 parts of $NaAsF_6$ to 97 parts of an 80:20 mixture of bisphenol-A-diglycidyl ether and 4-vinylcyclohexene dioxide. The reaction mixture was agitated by stirring for one-half hour and then allowed to settle. An aliquot of the resin was taken and spread onto a glass plate using a draw knife with a 3 ml aperture. A tack-free film formed within 15 seconds after exposure to an H3T7 lamp at a distance of six inches. The film was hard and clear.

Resistors were potted in the above resin by dipping the resistor into the sensitized resin and then curing it by rotating the resistor for 30 seconds beneath the ultraviolet lamp.

EXAMPLE 9

An equimolar mixture of diphenyliodonium fluoroborate and thioxanthene was heated at 200° C. for 3 hours. After crystallization from methylene chloride-diethyl ether, there was obtained an 80% yield of product having a m.p. of 168°–169° C. Based on method of preparation the product was S-phenylthioxanthene fluoroborate. A hard clear scratch resistant 1 mil coating was obtained, when a 3% solution of the above onium compound in limonene dioxide was knife coated onto a polystyrene sheet and exposed to UV irradiation from a 450 W Hanovia medium pressure mercury arc at a distance of 3 inches.

EXAMPLE 10

There were added 2.6 parts phenacyltetramethylene sulfonium bromide to a mixture of 95 parts of 4-vinylcyclohexene dioxide containing 2.2 parts of $NaAsF_6$. The solution was placed in a dark bottle and rolled on a ball mill for 8 hours. After the salts were removed by filtration, the solution was coated onto a 3 in×6 in steel panel and cured as in Example 1. A hard coating was obtained after 15 seconds exposure which could not be removed by rubbing the coating with acetone.

EXAMPLE 11

There were dissolved two parts of triphenylsulfonium hexafluoroantimonate into a 40:60 mixture of dicyclopentadiene dioxide and glycidyl acrylate. Following the procedure of example 1, a hard crosslinked 1 mil coating was obtained after a 15 second exposure to ultraviolet light.

EXAMPLE 12

There were added four parts of triphenylsulfonium hexafluoroarsenate to 100 parts of a blend of equal parts of 4-vinylcyclohexene dioxide and (3,4-epoxycyclohexyl)methyl-3,4-epoxycyclohexanecarboxylate. An aliquot of the resulting sensitized resin was spread onto a polycarbonate sheet using a draw-down blade to give a 0.5 mil film. The film was cured as described in Example 1 for 10 seconds resulting in a clear hard mar resistant and solvent resistant coating.

EXAMPLE 13

A mixture of 50 parts bisphenol-A-diglycidyl ether and 50 parts (3,4-epoxycyclohexyl)methyl-3,4-epoxycyclohexanecarboxylate was stirred until homogeneous. There was then added 3 parts of triphenylsulfonium hexafluoroantimonate to the solution. It was mixed until the sensitizer had dissolved. A portion of the above solution was coated onto a steel plate using a 0.2 mil drawbar. The plate was then exposed to a GE H3T7 lamp at a distance of six inches for 5 seconds. A hard cured adherent film formed on the steel.

EXAMPLE 14

A blend of epoxy resins consisting of 50 parts 4-vinylcyclohexene dioxide, 40 parts of a novolak-epoxy resin having an epoxy equivalent weight of 172-178 and 10 parts n-octylglycidyl ether were thoroughly mixed together. A 100 part aliquot was removed to which was added 1 part of triphenylsulfonium hexafluoroarsenate. The resulting mixture was stirred until the onium salt had dissolved. When the above mixture was coated onto a 3 in×6 in steel panel and exposed to a 450 watt medium pressure mercury arc lamp at a distance of 3 inches, a glossy, dry coating was obtained in 2 seconds. The coating withstood attack by hot boiling water for four hours. It could not be removed by rubbing with acetone.

EXAMPLE 15

There was added 10 parts of a solid multifunctional aromatic glycidyl ether having an epoxy equivalent weight of 210-240 to 40 parts of limonene dioxide. The mixture was combined with 1 part of phenacyltetramethylene sulfonium hexafluoroarsenate and stirred at 50° C. for 0.5 hour to produce a homogeneous solution. When the mixture was coated onto glass using a 0.5 mil drawbar, and irradiated for 5 seconds at a distance of 3 inches from a GE H3T7 mercury arc lamp having an intensity of 200 watts/sq. inch., a hard cured film was produced.

EXAMPLE 16

There was added 0.2 part of triphenylsulfonium hexafluoroantimonate in 2 parts of 4-vinylcyclohexene dioxide to 10 parts of an epoxidized butadiene resin. After mixing the components thoroughly, the mixture was applied to a 1/16 inch thick glass plate to a 1 mil thickness. Another plate of glass was placed on top of the first and the assembly was exposed to a GE H3T7 medium pressure mercury arc lamp having an intensity of 200 watts/sq. inch at a distance of three inches. The total exposure time was 30 seconds. The glass plates were permanently bonded together. Based on characteristics of the glass laminate, a similar procedure can be used to make a shatterproof windshield for automobiles.

EXAMPLE 17

There were added with stirring 89 parts of aluminum chloride in small portions to a solution of 122 parts of 2,6-xylenol in 505.12 parts of carbon disulfide maintained at 10° C. To the resulting greenish solution were added 79.5 parts of thionyl chloride in a dropwise fashion maintaining the temperature between 10° and 15° C. A black precipitate and solution was obtained which was stirred for an additional 2 hours and then poured onto 1000 parts of ice containing about 50 parts of concentrated HCl. This mixture was placed on a steam bath to remove CS$_2$ and to decompose the complex. A tan solid was obtained which was filtered, washed with water and dried.

To a solution of 21.5 parts of the above crude product in about 117 parts of hot absolute ethanol were added 11.4 parts of KAsF$_6$ and 10 parts of water. The reaction mixture was stirred and more water was added to effect the precipitation of product. The product was filtered, washed with water and dried. A material was obtained having a m.p. of 245°-251° C. Based on method of preparation and elemental analysis for C$_{24}$H$_{27}$O$_3$SAsF$_6$. Calc: % C, 49.3; % H, 4.62; % S, 5.48. Found: % C, 49.4; % H, 4.59; % S, 5.55, the product was tris-3,5-dimethyl-4-hydroxyphenyl sulfonium hexafluoroarsenate.

A three percent solution of the above onium salt was made with 4-vinylcyclohexene dioxide. Cure of the solution was effected by irradiating a 2 mil film on glass according to the procedure described in Example 3. A hard mar-resistant coating was obtained after 5 seconds of irradiation.

EXAMPLE 18

Three parts of triphenylsulfonium hexafluoroantimonate were ground to a fine powder. The powder was intimately mixed with 97 parts Reichhold Epotuf® 37-834 powder coating resin by tumbling these together for 30 minutes. The powder was then electrostatically sprayed onto 3 in×6 in steel panels to form approximately a 2 mil coating using a GEMA model 171 spray gun. Subsequently, the samples were heated briefly to 150° C. to fuse the powder and then exposed while hot to a GE H3T7 medium pressure mercury arc lamp at a distance of 3 inches. Cured samples were obtained after a 15 second irradiation. The cured films were adherent and mar resistant.

EXAMPLE 19

Triphenacyl hexafluoroarsenate was added to a mixture of 67% by weight of a novolak-epoxy resin having an epoxy equivalent weight of 172-178, 33% 4-vinylcyclohexene dioxide and 0.5% of a surface active agent. The resulting mixture contained about 1% by weight of the onium salt. A coating was applied as a 0.1 mil film to 3 in×6 in steel plates and cured for 20 seconds at a distance of 4 inches from a GE H3T7 medium pressure mercury arc lamp. Some panels were subsequently immersed for 5 hours at room temperature in methylene chloride. Other panels were immersed for 4 hours in acetone. In all cases, no visible signs of solvent attack of the coatings were observed. The same were then baked for 1 hour at 160° C. Tests were run separately in boiling 50% KOH solution for 30 minutes and in boiling distilled water for 4 hours. Again, no visible degradation of the coatings was observed.

EXAMPLE 20

Mixtures of triphenylsulfonium hexafluoroarsenate in 4-vinylcyclohexene dioxide having a concentration of 0 to 10% onium salt, were thermally aged at 25° C. and 55° C. The viscosities of the mixtures were measured over a two-week period (336 hrs.). The following results were recorded at 25° C.:

| Concentration (%) | Viscosity Start (cps) | Viscosity at 336 hr (cps) |
|---|---|---|
| 0 | 6.06 | 6.06 |
| 1 | 6.26 | 6.34 |
| 3 | 6.90 | 6.90 |
| 5 | 7.65 | 7.59 |
| 10 | 9.80 | 9.71 | at 55° C.:

| Concentration (%) | Viscosity Start (cps) | Viscosity at 336 hr (cps) |
|---|---|---|
| 0 | 6.06 | 6.06 |
| 1 | 6.42 | 6.37 |
| 3 | 6.91 | 6.93 |

| -continued | | |
|---|---|---|
| 5 | 7.65 | 7.67 |
| 10 | 9.75 | 9.71 |

Within experimental error, the above results show that there is essentially no viscosity change over the period the sensitizer was tested at a temperature range of 25° C. to 55° C.

Although the above examples are limited to only a few of the very many curable compositions and uses thereof which are included within the scope of the present invention, it should be understood that the present invention is intended to cover a much broader class of curable compositions and uses thereof. Those skilled in the art would also know that the curable compositions also cover the use of onium polymers containing Group VIa onium functionality as part of the polymer backbone or in the pendant position.

What I claim as new and desire to secure by Letters Patent of the United States is:

1. Photocurable compositions consisting essentially of
   (A) an epoxy resin polymerizable to a higher molecular weight state containing a hydroxy functional flexibilizer, and
   (B) from 0.1% to 15% by weight of a radiation sensitive aromatic onium salt of a Group VIa element capable of effecting the cure of (A) by exposure to radiant energy,
where the radiation sensitive aromatic onium salt has the formula,

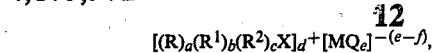

R is a monovalent aromatic organic radical, $R^1$ is a monovalent organic aliphatic radical selected from alkyl, cycloalkyl and substituted alkyl, $R^2$ is a polyvalent organic radical forming a heterocyclic or fused ring structure selected from aliphatic radicals and aromatic radicals, X is a Group VIa element selected from sulfur, selenium and tellurium, M is a metal or metalloid, Q is a halogen radical, a is a whole number equal to 0 to 3 inclusive, b is a whole number equal to 0 to 2 inclusive, c is a whole number equal to 0 or 1 where the sum of a+b+c is a value equal to 3 or the valence of X, d = e − f, f = valence of M and is an integer equal to from 2 to 7 inclusive, e is > f and is an integer having a value up to 8.

2. A curable composition in accordance with claim 1, where the onium salt is a sulfonium salt.

3. A curable composition in accordance with claim 1, where the onium salt is a selenium salt.

4. A curable composition in accordance with claim 1, where the onium salt is a tellurium salt.

5. A curable composition in accordance with claim 2, where the sulfonium salt is a dialkyl phenacyl sulfonium salt.

6. A curable composition in accordance with claim 1, having a sulfonium tetrafluoroborate salt.

7. A composition in accordance with claim 1, where a mixture of onium salts are employed.

8. A curable composition in accordance with claim 1, where the flexibilizer is a hydroxy functional polyester.

* * * * *